(12) United States Patent
Chin et al.

(10) Patent No.: US 12,490,404 B2
(45) Date of Patent: Dec. 2, 2025

(54) CENTRIFUGAL FAN MODULE

(71) Applicant: Delta Electronics, Inc., Taoyuan (TW)

(72) Inventors: Hui-Lun Chin, Taoyuan (TW); Pai-Yu Hsiao, Taoyuan (TW); Che-Wei Lee, Taoyuan (TW); Ching-Hsien Yeh, Taoyuan (TW); Chih-Wei Chan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 215 days.

(21) Appl. No.: 18/345,104

(22) Filed: Jun. 30, 2023

(65) Prior Publication Data

US 2024/0314969 A1 Sep. 19, 2024

(30) Foreign Application Priority Data

Mar. 14, 2023 (CN) .......................... 202320471825.6

(51) Int. Cl.
*H05K 7/20* (2006.01)

(52) U.S. Cl.
CPC ..... *H05K 7/20172* (2013.01); *H05K 7/20154* (2013.01)

(58) Field of Classification Search
CPC .......................... G06F 1/203; H05K 7/20136; H05K 7/20154; H05K 7/20172
See application file for complete search history.

(56) References Cited

U.S. PATENT DOCUMENTS

| | | | | |
|---|---|---|---|---|
| 7,443,672 B2 * | 10/2008 | Peng | ..................... | H01L 23/427 |
| | | | | 257/E23.084 |
| 7,885,073 B2 * | 2/2011 | Peng | ..................... | H01L 23/467 |
| | | | | 165/104.33 |
| 7,990,712 B2 * | 8/2011 | Fang | ........................ | G06F 1/20 |
| | | | | 361/679.52 |
| 2008/0105410 A1 * | 5/2008 | Hwang | ..................... | G06F 1/20 |
| | | | | 165/122 |
| 2009/0059525 A1 * | 3/2009 | Peng | ..................... | H01L 23/467 |
| | | | | 361/697 |
| 2009/0310296 A1 * | 12/2009 | Peng | ........................ | G06F 1/20 |
| | | | | 361/679.49 |

(Continued)

FOREIGN PATENT DOCUMENTS

CN 215927821 U 3/2022
TW I526624 B 3/2016

*Primary Examiner* — Eric S Ruppert
*Assistant Examiner* — Hans R Weiland
(74) *Attorney, Agent, or Firm* — MUNCY, GEISSLER, OLDS & LOWE, P.C.

(57) ABSTRACT

A centrifugal fan module is provided. The centrifugal fan module includes a housing, a blade unit, a heat sink and a vapor chamber. The housing includes a bottom cover, a sidewall, a top cover and an outlet structure, wherein the bottom cover is connected to the bottom of the sidewall, the top cover is connected to the top of the sidewall, and the outlet structure is connected to the top cover and the sidewall. The blade unit is disposed in the housing, wherein the blade unit is located between the bottom cover and the top cover. The heat sink is disposed on the vapor chamber, the heat sink is located between the vapor chamber and the top cover, and the heat sink is located between the outlet structure and the blade unit.

18 Claims, 7 Drawing Sheets

(56) References Cited

U.S. PATENT DOCUMENTS

| | | | |
|---|---|---|---|
| 2010/0139895 A1* | 6/2010 | Hwang | H01L 23/427 |
| | | | 165/104.26 |
| 2014/0092557 A1* | 4/2014 | Tu | G06F 1/1633 |
| | | | 165/80.3 |
| 2016/0010928 A1 | 1/2016 | Tsai et al. | |
| 2017/0367219 A1* | 12/2017 | Hsieh | H05K 7/20172 |
| 2018/0348826 A1* | 12/2018 | Aguirre | G06F 1/203 |

* cited by examiner

CENTRIFUGAL FAN MODULE

CROSS REFERENCE TO RELATED APPLICATIONS

This application claims priority of China Utility Model application No. 202320471825.6, filed on Mar. 14, 2023, the entirety of which is incorporated by reference herein.

BACKGROUND OF THE INVENTION

Field of the Invention

The present invention relates to a fan module, and, in particular, to a centrifugal fan module.

Description of the Related Art

Centrifugal fan modules are commonly utilized in various electronic devices. For example, notebook computers utilize centrifugal fan modules to provide a cooling effect. Conventionally, notebook computers include a heat pipe, a heat sink and a centrifugal fan module. The heat pipe connects the heat source to the heat sink. The centrifugal fan module blows air toward the heat sink to remove heat. Conventionally, when the heat passes through the heat pipe, the heat may spill over to the keyboard or the computer housing, and causes poor user experience. Additionally, with the increased computing requirements of the notebook computer, the heat generated by the CPU is increased, and this heat may accumulate on the heat pipe and the heat sink. Furthermore, when the airflow passes through the heat sink, the airflow generates an excessive amount of noise.

BRIEF SUMMARY OF THE INVENTION

An embodiment of the present invention provides a centrifugal fan module. The centrifugal fan module includes a housing, a blade unit, a heat sink and a vapor chamber. The housing includes a bottom cover, a sidewall, a top cover and an outlet structure, wherein the bottom cover is connected to the bottom of the sidewall, the top cover is connected to the top of the sidewall, and the outlet structure is connected to the top cover and the sidewall. The blade unit is disposed in the housing, wherein the blade unit is located between the bottom cover and the top cover. The heat sink is disposed on the vapor chamber, the heat sink is located between the vapor chamber and the top cover, and the heat sink is located between the outlet structure and the blade unit.

In one embodiment, the vapor chamber is connected to the bottom cover.

In one embodiment, the bottom cover comprises a bottom fastening portion and a bottom plate, the bottom fastening portion is formed on the bottom plate, a first portion of the vapor chamber is attached to the bottom plate, the vapor chamber comprises a first fastening portion, and the first fastening portion is affixed to the bottom fastening portion.

In one embodiment, the sidewall comprises a sidewall fastening portion, the vapor chamber comprises a second fastening portion, and the second fastening portion is affixed to the sidewall fastening portion.

In one embodiment, an opening is formed between the bottom cover and the outlet structure, the heat sink is disposed in the housing and corresponding to the opening, and a second portion of the vapor chamber covers the opening.

In one embodiment, the first inlet is formed on the top cover, the blade unit corresponds to the first inlet, and the first airflow enters the housing via the first inlet, passing through the heat sink, and leaves the housing via the outlet structure.

In one embodiment, the second inlet is formed on the bottom cover, the blade unit corresponds to the second inlet, and the second airflow enters the housing via the second inlet, passing through the heat sink, and leaves the housing via the outlet structure.

In one embodiment, the outlet structure separately extends in the wind-output direction.

In one embodiment, the sidewall is U-shaped. The outlet structure comprises a first side plate and a second side plate. The first side plate is connected to one end of the sidewall. The second side plate is connected to the other end of the sidewall. The distance between the first side plate and the second side plate increases gradually in the wind-output direction.

In one embodiment, the housing further comprises a restriction post, the restriction post is disposed on the outlet structure, the restriction post corresponds to the heat sink, and the restriction post is adapted to restrict the heat sink.

In the embodiment, the vapor chamber and the heat sink are disposed in the centrifugal fan module. Compared to the conventional art, the heat transmission path of the embodiment of the invention has less thermal resistance. In one embodiment, the vapor chamber may be in direct contact with the heat source (such as the CPU). The heat generated by the heat source can be transmitted to the heat sink via the vapor chamber, and the heat is removed by the airflow generated by the blade unit. The centrifugal fan module of the embodiment of the invention prevents heat accumulation, and the heat is prevented from being transmitted to the keyboard or the computer housing. This improves user experience. Additionally, the heat sink is disposed in the housing of the centrifugal fan module, and the noise generated by the airflow can be reduced.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
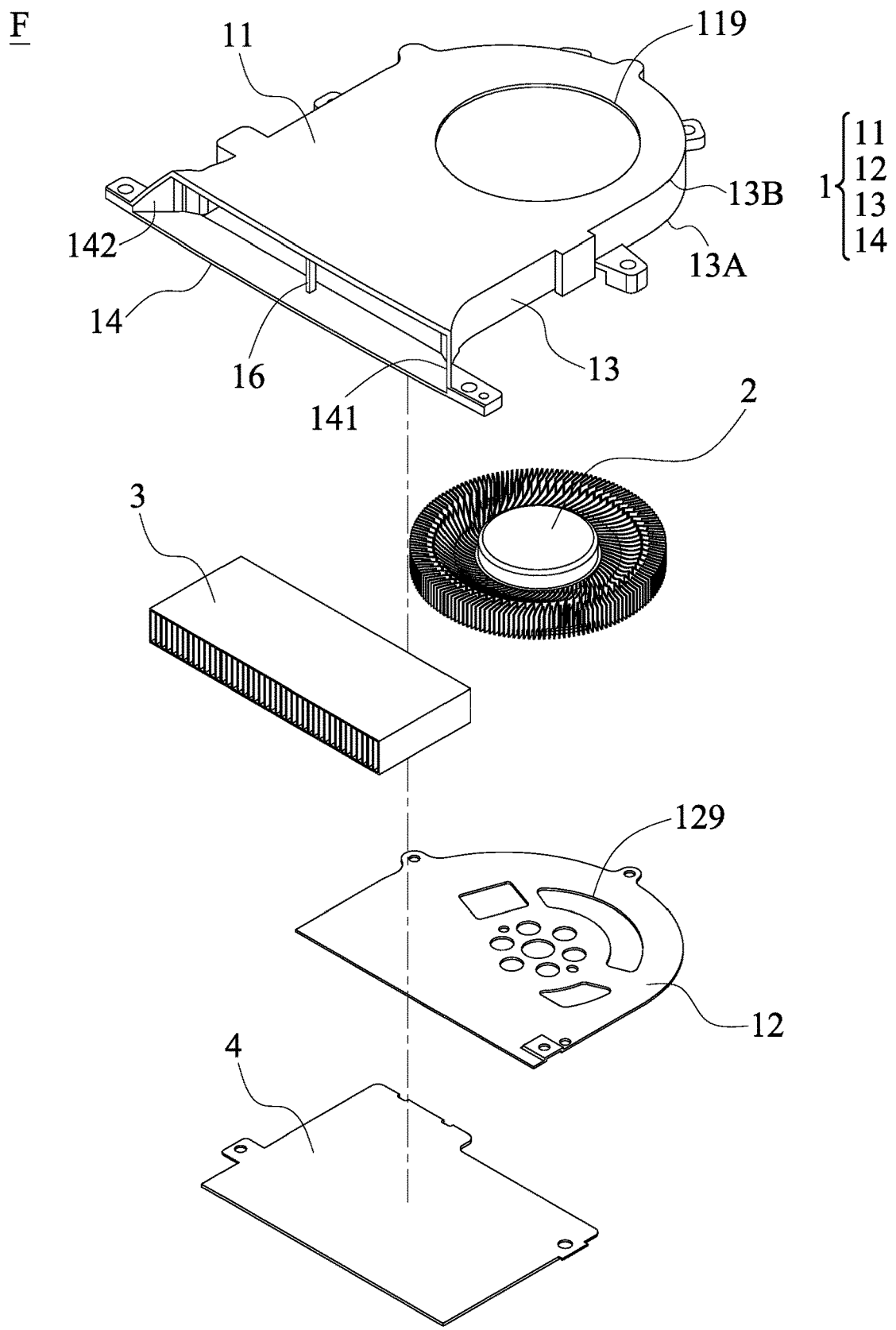
FIG. 1 is an exploded view of the centrifugal fan module of the embodiment of the invention.
Figure 2:
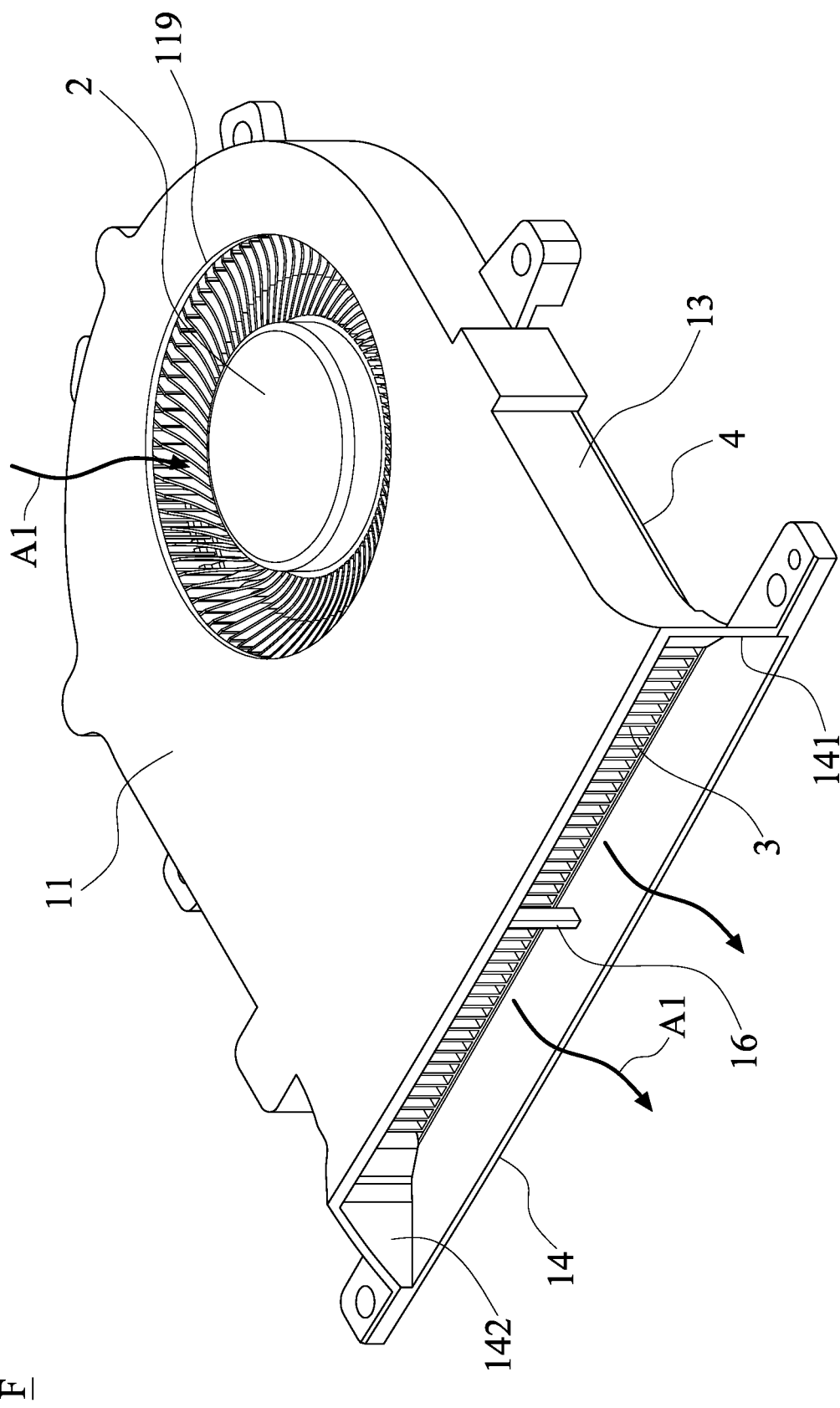
FIG. 2 is a perspective view of the centrifugal fan module of the embodiment of the invention.
Figure 3:
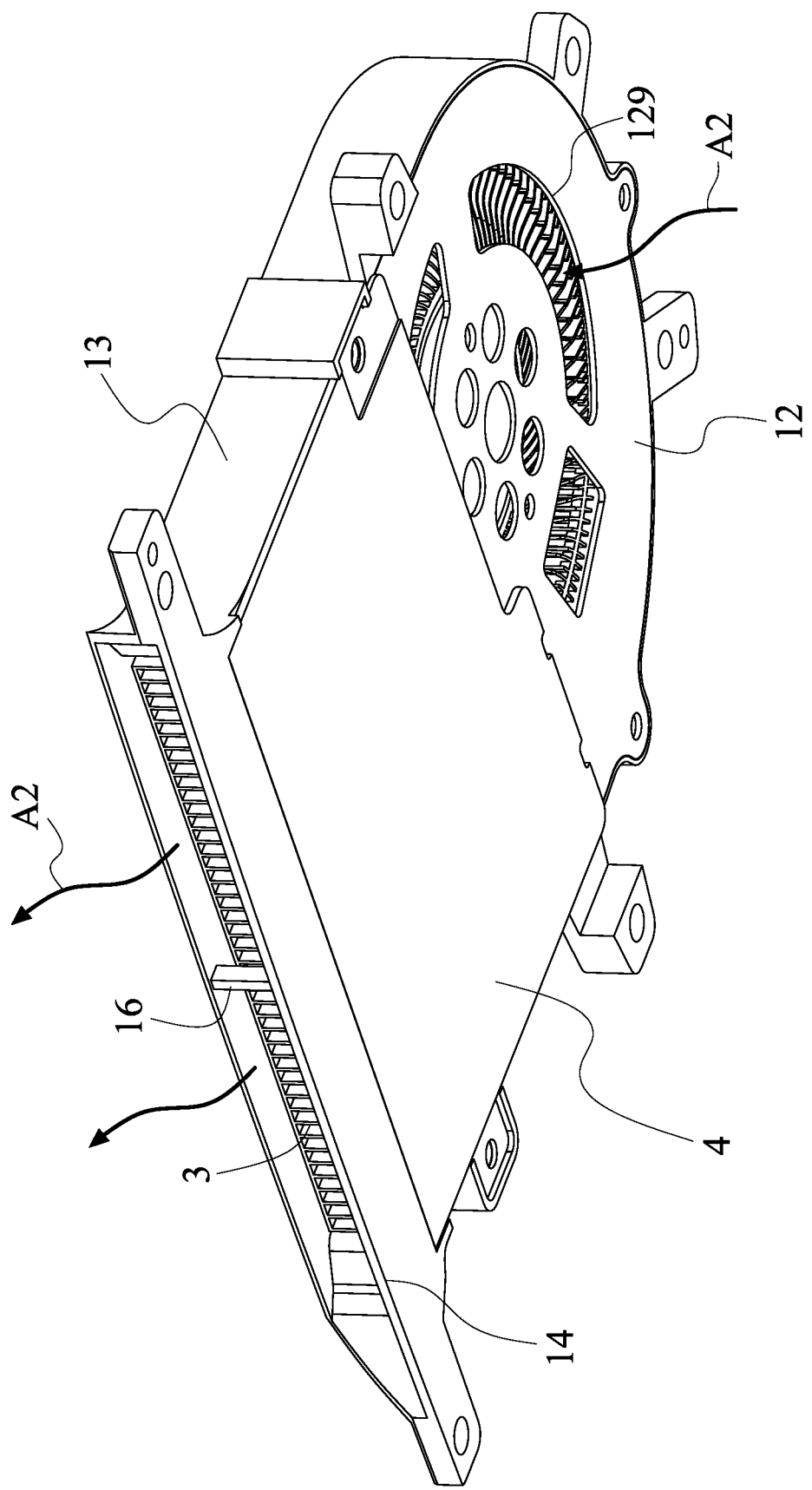
FIG. 3 is a perspective view of another view angle of the centrifugal fan module of the embodiment of the invention.

FIG. 1 is an exploded view of the centrifugal fan module of the embodiment of the invention. FIG. 2 is a perspective view of the centrifugal fan module of the embodiment of the invention. FIG. 3 is a perspective view of another view angle of the centrifugal fan module of the embodiment of the invention. With reference to FIGS. 1, 2 and 3, the centrifugal fan module F of the embodiment of the invention includes a housing 1, a blade unit 2, a heat sink 3 and a vapor chamber 4. The housing 1 includes a bottom cover 12, a sidewall 13, a top cover 11 and an outlet structure 14. The bottom cover 12 is connected to the bottom 13A of the sidewall 13. The top cover 11 is connected to the top 13B of the sidewall 13. The outlet structure 14 is connected to the top cover 11 and the sidewall 13. The blade unit 2 is disposed in the housing 1. The blade unit 2 is located between the bottom cover 12 and the top cover 11. The heat sink 3 is disposed on the vapor chamber 4. The heat sink 3 is located between the vapor chamber 4 and the top cover 11. The heat sink 3 is also located between the outlet structure 14 and the blade unit 2.

Figure 4A:
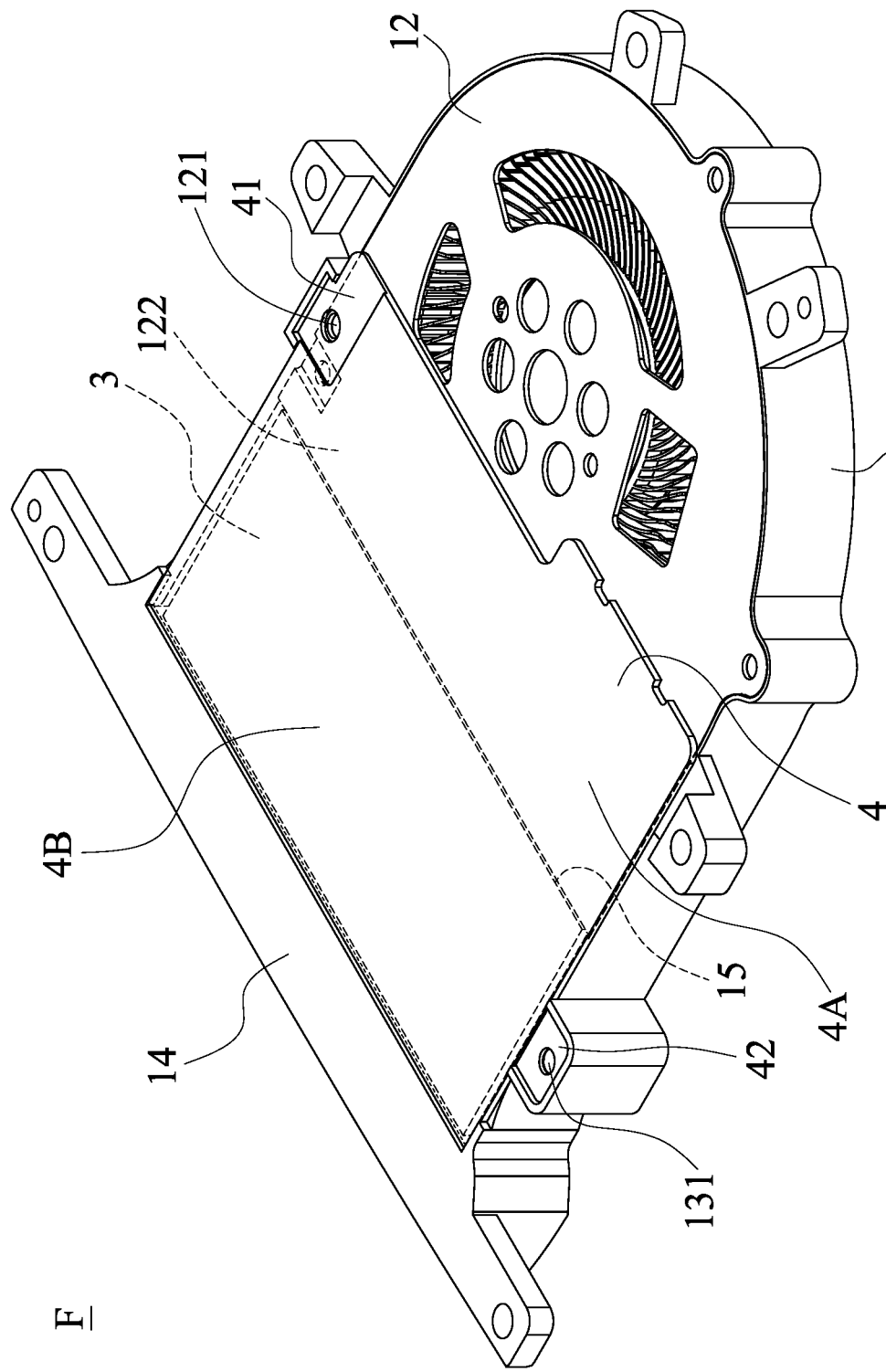
FIG. 4A shows the vapor chamber combined with the bottom cover of the embodiment of the invention.
Figure 4B:
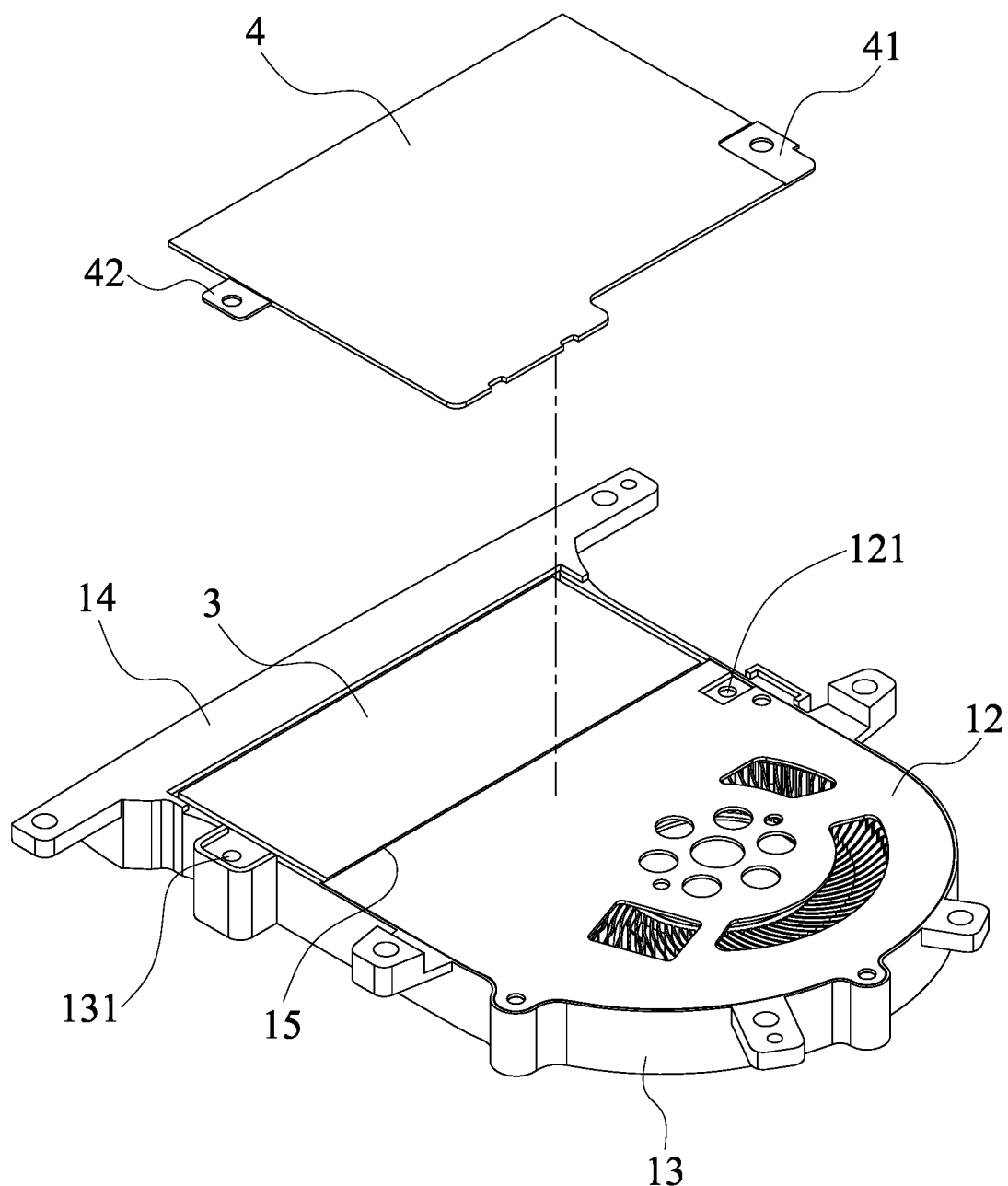
FIG. 4B shows the details of the vapor chamber of the embodiment of the invention.

FIG. 4A shows the vapor chamber combined with the bottom cover of the embodiment of the invention. FIG. 4B shows the details of the vapor chamber of the embodiment of the invention. With reference to FIGS. 4A and 4B, in one embodiment, the vapor chamber 4 is connected to the bottom cover 12. Particularly, in one embodiment, the bottom cover 12 comprises a bottom fastening portion 121 and a bottom plate 122. The bottom fastening portion 121 is formed on the bottom plate 122. A first portion 4A of the vapor chamber 4 is attached to the bottom plate 122. The vapor chamber 4 comprises a first fastening portion 41. The first fastening portion 41 is affixed to the bottom fastening portion 121. In one embodiment, the first fastening portion 41 can be affixed to the bottom fastening portion 121 by a bolt (not shown). The disclosure is not meant to restrict the invention.

With reference to FIGS. 4A and 4B, in one embodiment, the sidewall 13 comprises a sidewall fastening portion 131. The vapor chamber 4 comprises a second fastening portion 42. The second fastening portion 42 is affixed to the sidewall fastening portion 131. In one embodiment, the second fastening portion 42 is affixed to the sidewall fastening portion 131 by a bolt (not shown). The disclosure is not meant to restrict the invention.

With reference to FIGS. 4A and 4B, in one embodiment, an opening 15 is formed between the bottom cover 12 and the outlet structure 14. The heat sink 3 is disposed in the housing 1 and corresponding to the opening 15. A second portion 4B of the vapor chamber 4 covers the opening 15. In one embodiment, the vapor chamber 4 is connected to a heat source (such as the CPU) by thermal paste. The heat generated by the heat source thus con be sufficiently transmitted to the heat sink 3 in a shortest path. The disclosure is not meant to restrict the invention. In another embodiment, the vapor chamber 4 can be connected to other heat conductive means, such as a heat pipe.

In one embodiment, the vapor chamber has microstructures. The microstructures are formed on an inner wall of the vapor chamber. The disclosure is not meant to restrict the invention. For example, the vapor chamber can have other designs.

With reference to FIGS. 1 and 2, in one embodiment, a first inlet 119 is formed on the top cover 11. The blade unit 2 corresponds to the first inlet 119. The first airflow A1 enters the housing 1 via the first inlet 119, passing through the heat sink 3, and leaves the housing 1 via the outlet structure 14.

With reference to FIGS. 1 and 3, in one embodiment, a second inlet 129 is formed on the bottom cover 12. The blade unit 2 corresponds to the second inlet 129. The second airflow A2 enters the housing 1 via the second inlet 129, passing through the heat sink 3, and leaves the housing 1 via the outlet structure 14. In the embodiment of the invention, the first airflow A1 and the second airflow A2 leave the housing 1 via the outlet structure 14. The disclosure is not meant to restrict the invention. For example, in other embodiment, the second inlet 129 can be omitted.

Figure 5:
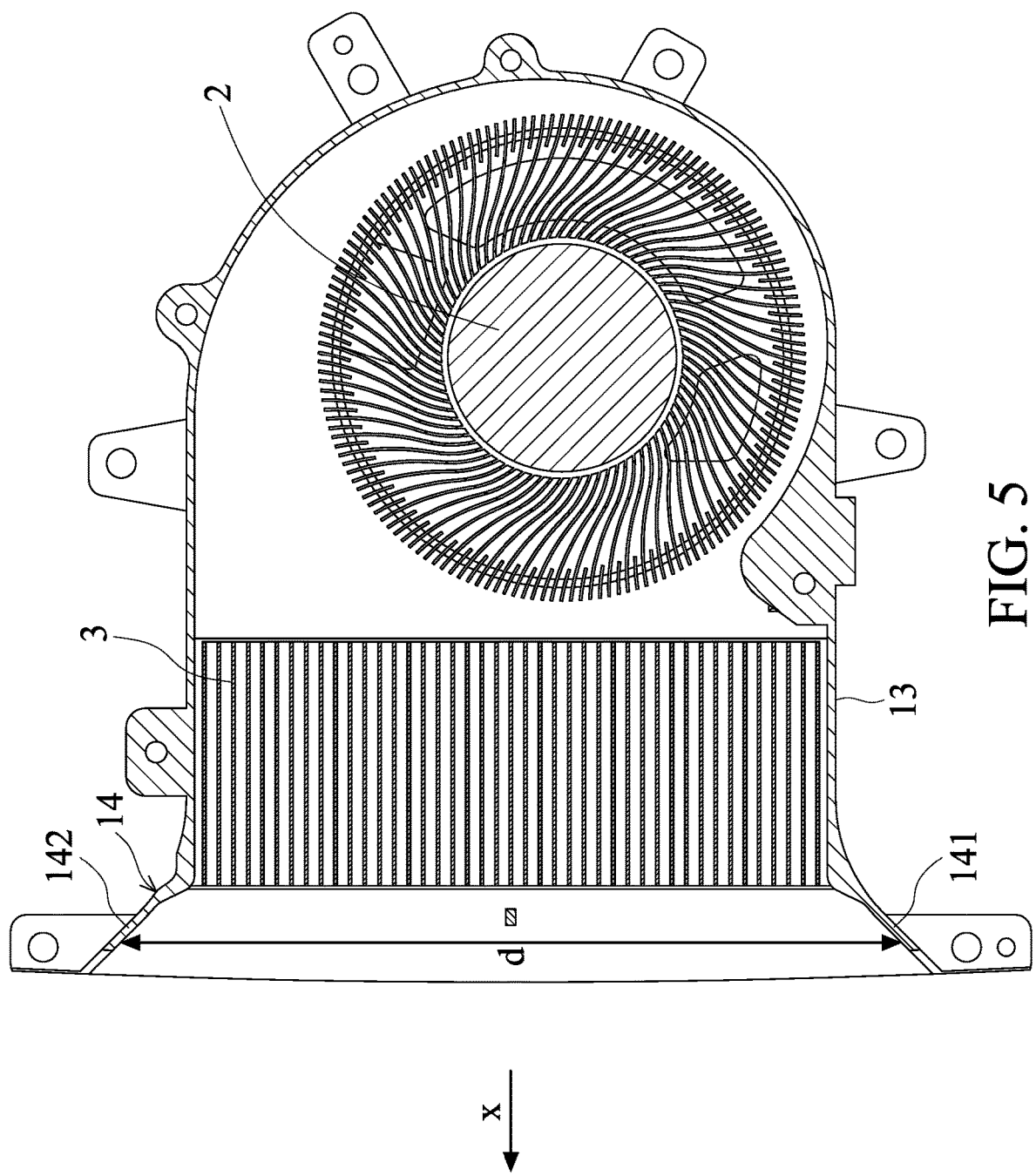
FIG. 5 is a cross sectional view of the centrifugal fan module of the embodiment of the invention.

FIG. 5 is a cross sectional view of the centrifugal fan module of the embodiment of the invention. With reference to FIGS. 1, 2 and 5, in one embodiment, the outlet structure 14 separately extends in the wind-output direction x. Particularly, in one embodiment, the sidewall 13 is U-shaped. The outlet structure 14 comprises a first side plate 141 and a second side plate 142. The first side plate 141 is connected to one end of the sidewall 13. The second side plate 142 is connected to the other end of the sidewall 13. The distance d between the first side plate 141 and the second side plate 142 increases gradually in the wind-output direction x. Therefore, the noise generated by the centrifugal fan module can be reduced.

With reference to FIGS. 1 and 2, in one embodiment, the housing 1 further comprises a restriction post 16. The restriction post 16 is disposed on the outlet structure 14. The restriction post 16 corresponds to the heat sink 3, and the restriction post 16 is adapted to restrict the heat sink 3. The heat sink 3 is thus prevented from coming out via the outlet structure 14.

Figure 6:
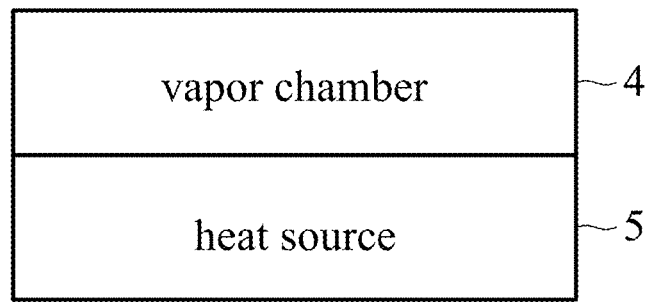
FIG. 6 shows a heat source of an embodiment of the invention.

In the embodiment, the vapor chamber and the heat sink are disposed in the centrifugal fan module. Compared to the conventional art, the heat transmission path of the embodiment of the invention has less thermal resistance. In one embodiment, the vapor chamber may be in direct contact with the heat source (such as the CPU). The heat generated by the heat source can be transmitted to the heat sink via the vapor chamber, and the heat is removed by the airflow generated by the blade unit. The centrifugal fan module of the embodiment of the invention prevents heat accumulation, and the heat is prevented from being transmitted to the keyboard or the computer housing. This improves user experience. Additionally, the heat sink is disposed in the housing of the centrifugal fan module, and the noise generated by the airflow can be reduced. FIG. 6 shows a heat source of an embodiment of the invention. With reference to FIG. 6, in one embodiment, an electronic device of the embodiment of the invention includes a heat source 5, and the vapor chamber contacts the heat source 5.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A centrifugal fan module, adapted to remove heat from a heat source, comprising:
    a housing, comprising a bottom cover, a sidewall, a top cover and an outlet structure, wherein the bottom cover is connected to the bottom of the sidewall, the top cover is connected to the top of the sidewall, and the outlet structure is connected to the top cover and the sidewall;

a blade unit, disposed in the housing, wherein the blade unit is located between the bottom cover and the top cover;
a heat sink; and
a vapor chamber, wherein the heat sink is disposed on the vapor chamber, the heat sink is located between the vapor chamber and the top cover, and the heat sink is located between the outlet structure and the blade unit,
wherein the vapor chamber contacts the heat source, and the vapor chamber is sandwiched between the heat source and the heat sink,
wherein the vapor chamber is connected to the bottom cover, and the bottom cover is partially located between the vapor chamber and the blade unit.

2. The centrifugal fan module as claimed in claim 1, wherein the bottom cover comprises a bottom fastening portion and a bottom plate, the bottom fastening portion is formed on the bottom plate, a first portion of the vapor chamber is attached to the bottom plate, the vapor chamber comprises a first fastening portion, and the first fastening portion is affixed to the bottom fastening portion.

3. The centrifugal fan module as claimed in claim 2, wherein the sidewall comprises a sidewall fastening portion, the vapor chamber comprises a second fastening portion, and the second fastening portion is affixed to the sidewall fastening portion.

4. The centrifugal fan module as claimed in claim 1, wherein an opening is formed between the bottom cover and the outlet structure, the heat sink is disposed in the housing and corresponding to the opening, and a second portion of the vapor chamber covers the opening.

5. The centrifugal fan module as claimed in claim 1, wherein a first inlet is formed on the top cover, the blade unit corresponds to the first inlet, and a first airflow enters the housing via the first inlet, passing through the heat sink, and leaves the housing via the outlet structure.

6. The centrifugal fan module as claimed in claim 5, wherein a second inlet is formed on the bottom cover, the blade unit corresponds to the second inlet, and a second airflow enters the housing via the second inlet, passing through the heat sink, and leaves the housing via the outlet structure.

7. The centrifugal fan module as claimed in claim 5, wherein the outlet structure extends separately in a wind-output direction.

8. The centrifugal fan module as claimed in claim 5, wherein the sidewall is U-shaped, the outlet structure comprises a first side plate and a second side plate, the first side plate is connected to one end of the sidewall, the second side plate is connected to the other end of the sidewall, and the distance between the first side plate and the second side plate increases gradually in the wind-output direction.

9. The centrifugal fan module as claimed in claim 8, wherein the housing further comprises a restriction post, the restriction post is disposed on the outlet structure, the restriction post corresponds to the heat sink, and the restriction post is adapted to restrict the heat sink.

10. An electronic device, comprising:
a heat source; and
a centrifugal fan module, comprising:
    a housing, comprising a bottom cover, a sidewall, a top cover and an outlet structure, wherein the bottom cover is connected to the bottom of the sidewall, the top cover is connected to the top of the sidewall, and the outlet structure is connected to the top cover and the sidewall;
    a blade unit, disposed in the housing, wherein the blade unit is located between the bottom cover and the top cover;
    a heat sink; and
    a vapor chamber, wherein the heat sink is disposed on the vapor chamber, the heat sink is located between the vapor chamber and the top cover, and the heat sink is located between the outlet structure and the blade unit,
    wherein the vapor chamber contacts the heat source, and the vapor chamber is sandwiched between the heat source and the heat sink,
    wherein the vapor chamber is connected to the bottom cover, and the bottom cover is partially located between the vapor chamber and the blade unit.

11. The electronic device as claimed in claim 10, wherein the bottom cover comprises a bottom fastening portion and a bottom plate, the bottom fastening portion is formed on the bottom plate, a first portion of the vapor chamber is attached to the bottom plate, the vapor chamber comprises a first fastening portion, and the first fastening portion is affixed to the bottom fastening portion.

12. The electronic device as claimed in claim 11, wherein the sidewall comprises a sidewall fastening portion, the vapor chamber comprises a second fastening portion, and the second fastening portion is affixed to the sidewall fastening portion.

13. The electronic device as claimed in claim 10, wherein an opening is formed between the bottom cover and the outlet structure, the heat sink is disposed in the housing and corresponding to the opening, and a second portion of the vapor chamber covers the opening.

14. The electronic device as claimed in claim 10, wherein a first inlet is formed on the top cover, the blade unit corresponds to the first inlet, and a first airflow enters the housing via the first inlet, passing through the heat sink, and leaves the housing via the outlet structure.

15. The electronic device as claimed in claim 14, wherein a second inlet is formed on the bottom cover, the blade unit corresponds to the second inlet, and a second airflow enters the housing via the second inlet, passing through the heat sink, and leaves the housing via the outlet structure.

16. The electronic device as claimed in claim 14, wherein the outlet structure extends separately in a wind-output direction.

17. The electronic device as claimed in claim 14, wherein the sidewall is U-shaped, the outlet structure comprises a first side plate and a second side plate, the first side plate is connected to one end of the sidewall, the second side plate is connected to the other end of the sidewall, and the distance between the first side plate and the second side plate increases gradually in the wind-output direction.

18. The electronic device as claimed in claim 17, wherein the housing further comprises a restriction post, the restriction post is disposed on the outlet structure, the restriction post corresponds to the heat sink, and the restriction post is adapted to restrict the heat sink.

* * * * *